United States Patent [19]
Bok

[11] Patent Number: 5,368,645
[45] Date of Patent: Nov. 29, 1994

[54] VACUUM CHUCK FOR COATING APPARATUS

[75] Inventor: Hendrik F. Bok, Fairhaven, Mass.

[73] Assignee: Specialty Coating Systems Inc., Indianapolis, Ind.

[21] Appl. No.: 126,324

[22] Filed: Sep. 24, 1993

[51] Int. Cl.⁵ .................. B05C 13/00; B23B 5/22; B25B 11/00
[52] U.S. Cl. .................. 118/500; 118/503; 279/3; 269/21; 269/903; 451/289; 451/388
[58] Field of Search ............ 118/500, 503, 313; 279/3; 269/21, 903; 51/131.5, 235

[56] References Cited

U.S. PATENT DOCUMENTS

| | | | |
|---|---|---|---|
| 4,370,356 | 1/1983 | Bok et al. | 427/38 |
| 4,457,359 | 7/1984 | Holden | 118/503 |
| 4,542,298 | 9/1985 | Holden | 118/503 |
| 4,561,688 | 12/1985 | Tsutsui | 294/64.1 |
| 4,609,037 | 9/1986 | Wheeler et al. | 165/61 |
| 4,671,204 | 6/1987 | Ballou | 118/59 |
| 4,872,417 | 10/1989 | Kuwabara et al. | 118/411 |
| 5,281,794 | 1/1994 | Uehara et al. | 219/243 |

*Primary Examiner*—Robert J. Warden
*Assistant Examiner*—Christopher Y. Kim
*Attorney, Agent, or Firm*—W. K. Volles

[57] ABSTRACT

Apparatus for coating the surface of an object with a coating material are disclosed. The apparatus comprise a vacuum chuck assembly suitable for holding the object to be coated in a downward, i.e., inverted position, and a coating material applicator movably positioned beneath the vacuum chuck assembly to traverse the surface of the object in a generally parallel direction to the surface. The vacuum chuck assembly provides a means for temperature control as well as a means for establishing a vacuum for holding the object in the inverted position.

10 Claims, 3 Drawing Sheets

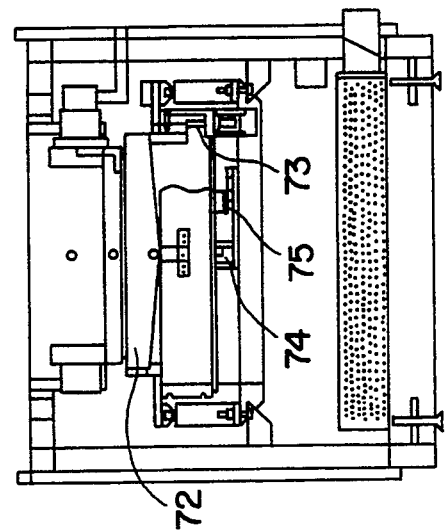
F I G. 5
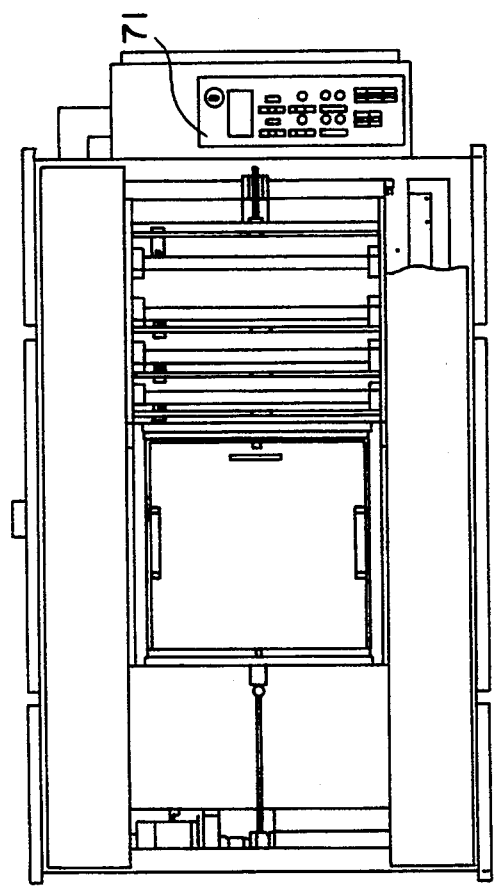
F I G. 4
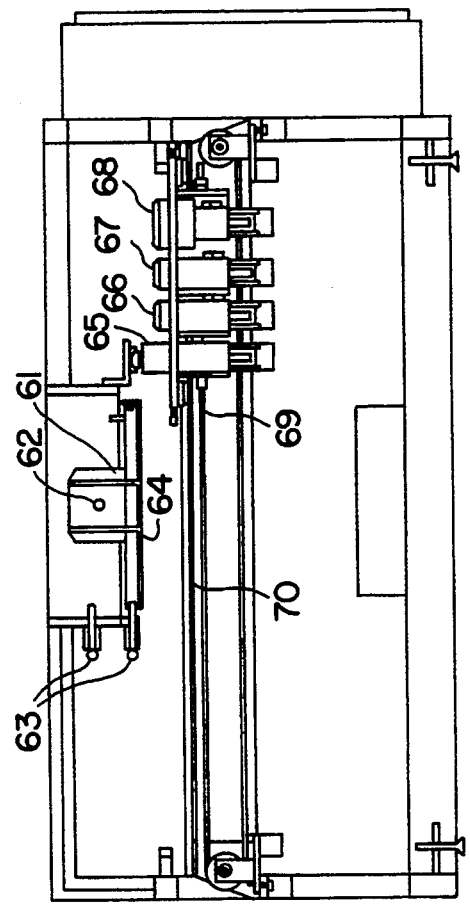
F I G. 3

VACUUM CHUCK FOR COATING APPARATUS

FIELD OF THE INVENTION

The present invention relates to apparatus for coating objects. More specifically, the present invention relates to apparatus for applying thin coatings to objects having flat or curved planar surfaces.

BACKGROUND OF THE INVENTION

The application of thin coatings of coating materials, i.e. less than about 10 microns, has become an increasingly important step in the manufacture of various products including, for example: flat panel displays, such as those used in lap top computers, high definition television and cathode ray tubes; optical devices, such as, lenses, color filters and mirrors; hybrid circuit boards; silicon wafers and germanium wafers.

One particularly useful apparatus for applying thin coatings to objects is described in U.S. Pat. No. 4,370,356, issued Jan. 25, 1983. The patent discloses an apparatus for coating the surface of an object with a coating material. The apparatus comprises a vacuum chuck assembly which is pivotably mounted in the apparatus between an upward position, wherein the object can be placed onto the vacuum chuck assembly such that the surface of the object faces generally upward, and a downward position, wherein the surface of the object faces downward in a generally horizontal plane and the object is held in place by vacuum. The apparatus further comprises an applicator, i.e., a coating material applicator, which is movably positioned beneath the vacuum chuck assembly in order to traverse the surface of the object in a generally parallel direction to the surface of the object. When the coating material applicator is traversed beneath the surface of the object, coating material is transferred from the applicator to the surface of the object. The patent also discloses a means for introducing the coating material through the applicator onto the surface of the object, e.g., a pump. In addition, the patent discloses that the vacuum chuck assembly is movably positioned within the frame of the apparatus to move from a loading position, wherein the object can be loaded onto the vacuum chuck assembly, to a coating position, wherein the coating is conducted, and finally to a heating or drying position, wherein volatile components in the coating material can be removed.

SUMMARY OF THE INVENTION

In accordance with the present invention, improved apparatus are provided for coating the surfaces of objects with coating materials. The improvement in the apparatus of the present invention is directed to the vacuum chuck assembly. By virtue of the present invention, it is now possible to provide a vacuum means for holding the object to the vacuum chuck assembly and a means for controlling the temperature of the vacuum chuck assembly prior to, during and after the coating operation. Thus, in accordance with the present invention, it is no longer necessary to provide separate loading, coating and drying positions within the apparatus. As a result, the physical size of the apparatus can be reduced.

BRIEF DESCRIPTION OF THE DRAWINGS

FIG. 3 illustrates a front view of an apparatus comprising a vacuum chuck assembly in accordance with the present invention.

FIG. 4 illustrates a top view of the apparatus shown in FIG. 3.

FIG. 5 illustrates a side view of the apparatus shown in FIG. 3.

DETAILED DESCRIPTION OF THE INVENTION

The particular objects being coated are not critical to the present invention. However, it is advantageous if the surface of the object provides attractive forces for the coating material, i.e., the surface is wettable by the coating material. Preferably, the objects have a curved or flat planar surface. The materials of construction of the objects can be, for example, glass, ceramics, metals, plastics and combinations thereof. Typical objects suitable for coating include, but are not limited to; flat panel displays such as used in lap top computers, high definition television and computer cathode ray tubes; optical devices such as lenses, color filters and mirrors; hybrid circuit boards and silicon and germanium wafers, also referred to in the art as semiconductors.

Similarly, the particular coating material used to coat the objects is not critical to the present invention. Typical coating materials include, but are not limited to, photoresists, lacquers, dopants, polyimides, anti-reflection coatings, and the like. The coating material will generally be present in a liquid form dissolved in a solvent. The concentration of the coating material in the solution of solvent and coating material, often expressed as "solids content", will typically be from about 0.5 to 50 weight percent and preferably from about 0.5 to 15 weight percent, based on the total weight of the coating material and the solvent. Preferably, the liquid containing the coating material is capable of wetting, i.e., forming a film, the surface of the object to be coated. Typical solvents used with the coating materials include, for example, N-methylpyrrolidone, xylene, and methyl ethyl ketone. Those skilled in the art can determine the appropriate coating materials, solids content and solvents in amounts suitable for the specific objects to be coated.

The invention is further described with reference to the drawings which are presented for illustrative purposes and are not intended to limit the scope of the claims which follow. Those skilled in the art will recognize that the drawings are presented in a simplified form and do not illustrate various details which are known to those skilled in the art such as, for example, valves, switches, process control devices, wiring, heating elements, machine frames, and the like.

Figure 1:
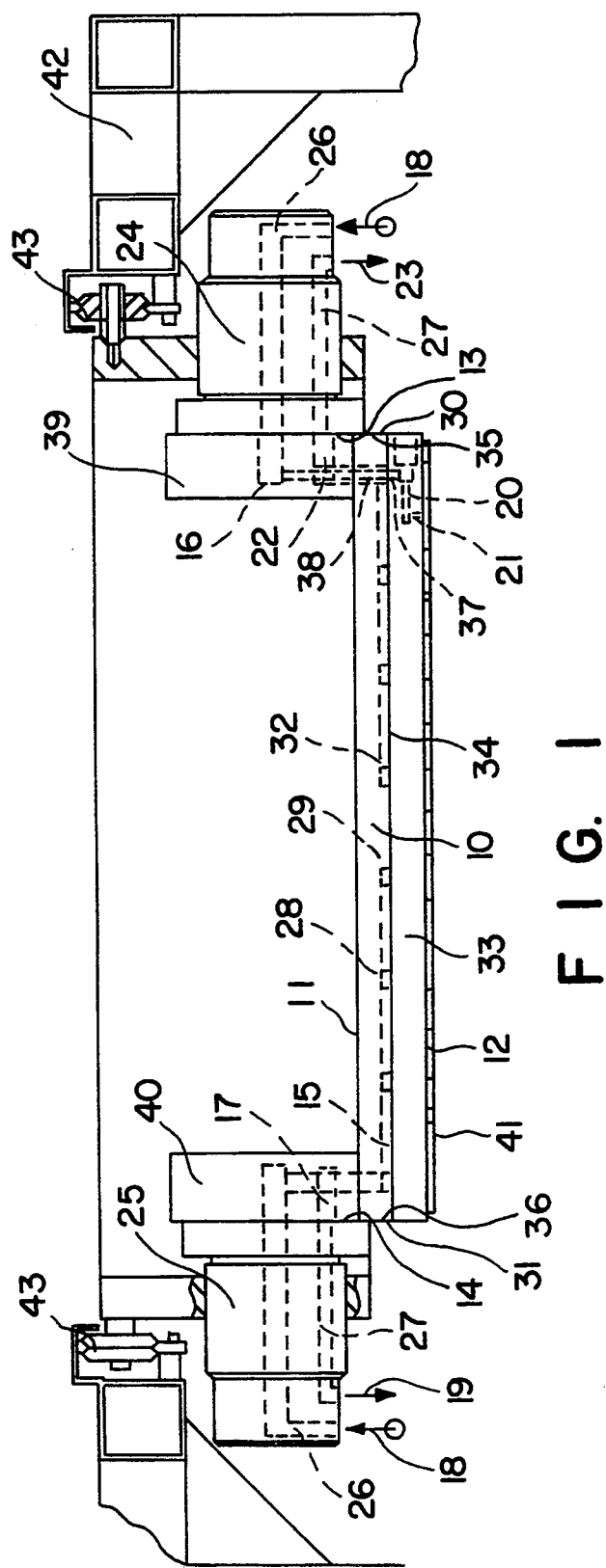
FIG. 1 illustrates a side view of a vacuum chuck assembly in accordance with the present invention. The vacuum chuck assembly is shown in a downward, i.e., coating position.

FIG. 1 illustrates a side view of vacuum chuck assembly in accordance with the present invention. The vacuum chuck assembly is illustrated in a downward position. More specifically, the rotation of the vacuum chuck assembly is downward such that the surface of the object to be coated, when loaded on the vacuum chuck assembly, would also be facing downward, i.e., inverted. The vacuum chuck assembly comprises a plate assembly 10 having an outer top side 11, an outer bottom side 12, a first end 13, and a second end 14.

A first continuous conduit 15 is disposed in between the outer top side and the outer bottom side of the plate assembly. The first conduit has an entrance port 16 which is in communication with at least one of the first end or the second end of the plate assembly (first end shown). In addition, the first continuous conduit has an exit port 17 which is communication with at least one of the first end or the second end of the plate assembly (second end shown).

The function of the first conduit is to transport a heat exchange fluid within the plate assembly for temperature control. Entrance and exit locations for the heat exchange fluid are schematically represented by elements 18 and 19.

Suitable heat exchange fluids are known to those skilled in the art. Water is often a suitable heat exchange fluid depending upon the desired coating and drying temperatures. Glycols are also often suitable for use as heat exchange fluids. Other heat exchange fluids, such as, for example, FLUORINERT® electronic fluids which are available in a variety of boiling points are also suitable. Such fluids are available for example, from 3M Company, St. Paul, Minn.

The physical characteristics of the first conduit are not critical to the present invention. For example, the first conduit may be comprised of a hollow member, such as a length of tubing, which is imbedded in the plate assembly. Alternatively, as shown in FIG. 1, the first conduit may be comprised of an opening formed within the plate assembly. The scope of the present invention is intended to include first conduits having any physical characteristics which render them suitable for passing a heat exchange fluid therethrough.

A second continuous conduit 20 is provided having a suction port 21 in communication with the outer bottom side of the plate assembly and a discharge port 22 in communication with at least one of the first end or the second end of the plate assembly (first end shown). The function of the second continuous conduit is to provide a means for establishing a vacuum at the outer bottom side of the plate assembly in order to hold the object to be coated in place when the vacuum chuck assembly is in the downward position. Thus, the second conduit must be capable of passing a vacuum gas therethrough. Provided that such function can be performed, the physical characteristics of the second conduit are not critical to the present invention. Various physical characteristics, configurations, which can be determined by those skilled in the art, are intended to be included within the scope of the invention.

Preferably, the first conduit and the second conduit do not intersect with each other. It is also preferred that there be substantially no transfer of heat exchange fluid into the second conduit, i.e., less than about 10 percent. It is also preferred that there be substantially no transfer of vacuum gas from the second conduit into the first conduit.

The plate assembly is suspended between a first rotating union 24 which is rotatably fastened to the first end of the plate assembly and a second rotating union 25 which is rotatably fastened to the second end of the plate assembly. The first rotating union and the second rotating union have openings therethrough positioned to provide communication with at least one entrance port and exit ports of the first conduit and communication with the discharge port when the vacuum chuck assembly is in the downward position. As shown in FIG. 1, openings 26 and 27 are provided in both the first rotating union and the second rotating union to provide entrance and exit openings for the heat exchange fluid, i.e., lines 18 and 19, and to provide an exit opening for the vacuum gas i.e., line 23. Preferably, the first rotating union and the second rotating union are configured such that openings are provided for all entrance and exit ports for the heat exchange fluid as well as the discharge port for the vacuum gas, when the vacuum chuck assembly is in either the upward position or the downward position. Further details concerning the rotating unions of the present invention are known to those skilled in the art. Suitable rotating unions are available, for example, from Deublin Company, Northbrook, Ill.

The plate assembly may be fabricated by any means known to those skilled in the art. For example, the plate assembly may be fabricated by casting a mold of the desired plate assembly material, e.g., metal or plastic, around the first conduit and the second conduit in the mold. In addition, the plate assembly can be comprised of a solid plate of the desired plate material with first conduit and the second conduit formed or machined therein.

Preferably, the plate assembly comprises an upper plate 28 comprising the outer top side of the plate assembly, an inner bottom side 29, an upper first end section 30 comprising a portion of the first end of the plate assembly, and an upper second end section 31 comprising a portion of the second end of the plate assembly. Preferably, the inner bottom side of the upper plate has at least one open channel 32 therein which forms a portion of the first conduit. Preferably, the plate assembly, also comprises a lower plate 33 comprising an inner top side 34, the outer bottom side of the plate assembly, a lower first end section 35 comprising a portion of the first end of the plate assembly, and a lower second end section 36 comprising a portion of the second end of the plate assembly. Preferably, the second conduit passes through an opening 37 in the inner top side of the lower plate. It is also preferred, that the upper plate has an opening 38 in the inner bottom side which is in communication with the opening in the inner top side of the lower plate.

The vacuum chuck assembly also preferably comprises a first mounting block 39 which is removably attached to the first rotating union and to the plate assembly. Mounting block 39 can be attached to the outer top side of the upper plate as shown in FIG. 1 or alternatively, mounting block 39 can be attached to the first end of the plate assembly. In the aspect of the invention illustrated in FIG. 1, the first conduit and second conduit pass through mounting block 39 and into the first rotating union. A second mounting block 40 is removably attached to the second rotating union and to the plate assembly in a similar fashion as described with respect to the first mounting block.

The vacuum chuck assembly also preferably comprises a vacuum chuck plate 41 which has a plurality of openings therethrough which are in communication with the suction end of the second conduit 21. In this preferred aspect of the invention, the vacuum chuck plate is readily removable and interchangeable with other vacuum chuck plates in order to accommodate objects having different sizes and geometries.

The materials of construction of the vacuum chuck assembly are not critical to the present invention. Thus, the vacuum chuck assembly may be comprised of any suitable material known to those skilled in the art, such as, for example, metals, e.g., steel, aluminum, alloys, plastics, carbon fiber, composite materials, and the like. In the aspect of the invention illustrated in FIG. 1, the upper plate and lower plate are comprised of aluminum, the vacuum chuck plate is comprised of anodized aluminum, the mounting blocks are comprised of anodized aluminum and the rotating unions are comprised of stainless steel.

Preferably, the upper plate and lower plate are bolted together and a silicone rubber gasket is used between the plates. The vacuum chuck is preferably bolted to the lower plate and a vacuum tight seal, e.g., silicone applied in liquid form, is used to seal the vacuum chuck plate to the lower plate.

Various pieces of equipment common to those skilled in the art, can be used in conjunction with the vacuum chuck assembly. For example, pumps, tubing, valves, thermal couples, temperature controllers, and the like, are preferably employed to circulate the heat exchange fluid (both in heating and cooling modes), and to provide appropriate vacuum means. The details concerning such equipment and its operation, are known to those skilled in the art.

An apparatus frame 42 supporting the vacuum chuck assembly is shown in FIG. 1. Also illustrated are rollers 43 which are optional and used when it is desirable to move the vacuum chuck assembly from one position, e.g., a loading position, to another position, e.g., a coating or drying position.

Figure 2:
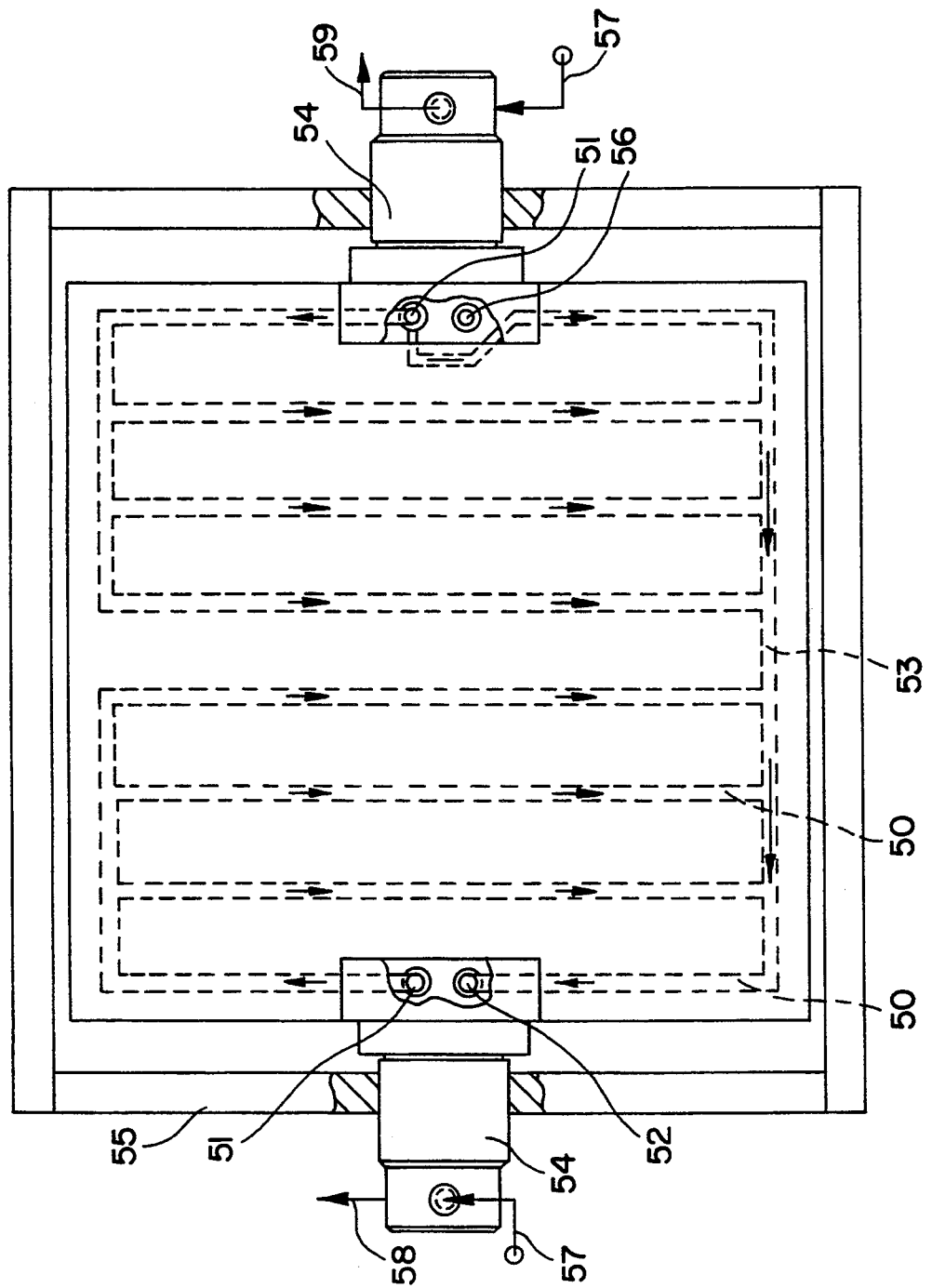
FIG. 2 illustrates a top view of a vacuum chuck assembly in accordance with the present invention.

FIG. 2 illustrates a top view of a vacuum chuck assembly such as described with reference to FIG. 1. The upper plate of the plate assembly comprises a plurality of open channels 50 which are connected in a manner to permit the flow of the heat exchange fluid from entrance port 51 of the first conduit to exit port 52 of the first conduit. Preferably, channels 50 are aligned in a generally parallel orientation to each other. In addition, it is preferred that additional open channels 53 are also provided which are aligned in a generally perpendicular orientation to parallel channels 50 and disposed at each end of parallel channels 50. FIG. 2 also illustrates rotating unions 54 mounted in frame 55. A second conduit discharge port, i.e., for vacuum discharge, is illustrated by opening 56. Heat exchange fluid supply lines are illustrated by lines 57. A heat exchange fluid discharge line is illustrated by line 58 and a vacuum discharge line is illustrated by line 59. As illustrated in FIG. 2, the open channels which comprise a portion of the first conduit, are preferably machined into the inner bottom side of the top plate of the plate assembly. When the top plate and bottom plate are bolted together, the portions of the inner top side of the bottom plate which coincide with the open channels in the top plate form a continuous side wall of the first conduit.

FIG. 3 illustrates a front view of a coating apparatus comprising the vacuum chuck assembly of the present invention. A vacuum chuck assembly 61 is mounted in the apparatus via two rotating unions 62, such as described above with reference to FIG. 1. Two spring loaded pins 63 are used to hold the vacuum chuck assembly, either in an upright position for loading the object 64 onto the vacuum chuck assembly or in the inverted position for the coating cycle. Coating modules 65 to 67, i.e., applicators, and a cleaning module 68 are mounted to a carriage which is moved by a DC motor drive (not shown) and a cable arrangement 69. The horizontal movement is guided by precision roller bearings and guide shafts 70 (one shown).

In a typical mode of operation, vacuum chuck assembly 61 would be rotated to its upward position so that object 64 could be mounted thereon. A vacuum would then be initiated to hold object 64 onto vacuum chuck assembly 61. Then, vacuum chuck assembly 61 would be rotated to the downward position and locked into position using spring loaded pins 63. Cleaning module 68 would then be advanced in a generally horizontal direction and generally parallel to the surface of object 64 along guide shaft 70. After the cleaning step, the surface of object 64 may be heated by passing a heat exchange fluid through vacuum chuck assembly 61 as described above with reference to FIG. 1. The temperature of the object 64 may then be adjusted by continuing the heat exchange to the desired coating temperature. Then, one or all of coating modules 65–67 are advanced sequentially along guide shaft 70 in a similar fashion to cleaning module 68, in order to coat the surface of the object with the desired coating material. After the coating step is complete, the surface of the object can be heated in order to dry the coating and remove volatiles present in the coating material by passing a heat exchange fluid through the vacuum chuck assembly as described with reference to FIG. 1. After the drying step, object 64 may be cooled with the heat exchange fluid to the desired handling temperature, e.g., room temperature. Then the vacuum chuck assembly can be rotated to its upward position for release of the vacuum and removable of object 64 from the vacuum chuck assembly.

FIG. 4, illustrates a top view of the apparatus shown in FIG. 3. FIG. 4 illustrates control panel 71 which houses various process controllers, instruments, switches, valves, and the like, suitable for conducting the coating process. The details concerning such equipment and instrumentation is known to those skilled in the art.

FIG. 5, illustrates a side view of the apparatus shown in FIG. 3. A housing 72 containing cleaning module 68 is vertically adjustable by two lead screws 73 (one shown) and a stepper motor 74 via timing belt 75.

Although the invention has been described with respect to specific aspects, those skilled in the art will recognize that other aspects are intended to be included within the scope of the claims which follow.

I claim:

1. In an apparatus for coating the surface of an object with a coating material comprising:
   a) a vacuum chuck assembly pivotably mounted in the apparatus between an upward position wherein the object can be placed onto the vacuum chuck assembly such that the surface of the object faces generally upward and a downward position wherein the surface of the object faces downward in a generally horizontal plane;
   b) an applicator movably positioned beneath the vacuum chuck assembly to traverse the surface of the object in a generally parallel direction to the surface;
   c) a means for introducing the coating material through the applicator onto the surface of the object; and
   d) a means for heating the surface of the object;
   the improvement wherein the vacuum chuck assembly comprises:
   i) a plate assembly having an outer top side, an outer bottom side, a first end and a second end;

ii) a first conduit means connected to a source of heating and cooling fluid disposed in between the outer top side and the outer bottom side having an entrance port in communication with at least one of the first end or the second end and an exit port in communication with at least one of the first end or the second end, said first conduit means for heating and cooling the object by passing a heat exchange fluid therethrough; and iii) a second conduit means connected to a source of vacuum in the plate assembly which does not intersect with the first conduit means, said second conduit means having a suction port in communication with the outer bottom side and a discharge port in communication with at least one of the first end or the second end, said second conduit means for discharging a vacuum gas therethrough.

2. The apparatus of claim 1, wherein the plate assembly is suspended between a first rotating union rotatably fastened to the first end and a second rotating union rotatably fastened to the second end, said first rotating union and second rotating union having openings therethrough oriented to provide communication with the entrance port, the exit port and the discharge port when the vacuum chuck assembly is in the downward position.

3. The apparatus of claim 1 wherein the plate assembly comprises an upper plate comprising said outer top side, an inner bottom side, an upper first end section comprising a portion of said first end, and upper second end section comprising a portion of said second end, said inner bottom side having at least one open channel therein which forms a portion of the first conduit means.

4. The apparatus of claim 3 comprising a plurality of open channels which are connected in a manner to permit flow of the heat exchange fluid from the entrance port of the first conduit means to the exit port of the first conduit means.

5. The apparatus of claim 4 comprising a plurality of open channels aligned in a generally parallel orientation to each other and connected to each other at one end by a first perpendicular channel disposed in a generally perpendicular orientation to the parallel channels and connected to each other at the other end by a second perpendicular channel disposed in a generally perpendicular orientation to the parallel channels.

6. The apparatus of claim 3 wherein the plate assembly further comprises a lower plate comprising an inner top side, the outer bottom side, a lower first end section comprising a portion of first end and a lower second end section comprising a portion of the second end, said second conduit means passing through an opening in the inner top side.

7. The apparatus of claim 6 wherein the upper plate has an opening in the inner bottom side which is in communication with the opening in the inner top side of the lower plate.

8. The apparatus of claim 6 wherein the first conduit means has a continuous side wall, one portion of which is comprised of the inner walls of the open channel in the inner bottom side of the upper plate and another portion of which is comprised of the portions of the inner top side of the lower plate which coincide with the open channel.

9. The apparatus of claim 1 which further comprises a first mounting block removably attached to the first rotating union and to the plate assembly.

10. The apparatus of claim 9 which further comprises a second mounting block removably attached to the second rotating union and to the plate assembly.

* * * * *